(12) United States Patent
Lee et al.

(10) Patent No.: US 7,012,449 B2
(45) Date of Patent: Mar. 14, 2006

(54) INPUT AND OUTPUT DRIVER

(75) Inventors: Chang Yeol Lee, Seoul (KR); Myeong Kook Gong, Yongin-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 57 days.

(21) Appl. No.: 10/730,634

(22) Filed: Dec. 8, 2003

(65) Prior Publication Data
US 2004/0218423 A1    Nov. 4, 2004

(30) Foreign Application Priority Data
Apr. 30, 2003    (KR) .................. 10-2003-0027679

(51) Int. Cl.
*H03K 9/0185*    (2006.01)
(52) U.S. Cl. .................. 326/82; 326/83; 326/56; 326/57

(58) Field of Classification Search ............ 326/82–83, 326/86, 90, 56–58; 365/189.01, 189.03, 365/189.04, 189.06, 189.05
See application file for complete search history.

(56) References Cited

U.S. PATENT DOCUMENTS

| | | | | |
|---|---|---|---|---|
| 5,535,163 A | * | 7/1996 | Matsui | 365/201 |
| 5,631,579 A | * | 5/1997 | Miki et al. | 326/58 |
| 5,736,887 A | * | 4/1998 | Spence | 327/333 |
| 6,121,795 A | * | 9/2000 | Curd et al. | 326/83 |

* cited by examiner

*Primary Examiner*—Anh Q. Tran
(74) *Attorney, Agent, or Firm*—Marshall, Gerstein & Borun LLP

(57) ABSTRACT

An input and output driver is disclosed which includes comprising a DQ switch capable of reducing a total input capacitance Cin by electrically isolating an output driver from a DQ pad using the DQ switch in a writing mode to reduce the capacitance due to the output driver.

19 Claims, 6 Drawing Sheets

INPUT AND OUTPUT DRIVER

BACKGROUND

1. Technical Field

The present invention relates to an input and output driver and, more specifically, to an input and output driver capable of effectively reducing an input capacitance (Cin) of a double data rate (DDR)-III product.

2. Discussion of Related Art

Double data rate (DDR)-III standard graphic DRAM products require a channel impedance of 40Ω in which at least 30Ω tuning is supported. Furthermore, an on-die termination (ODT) circuit, which is provided to match impedance between a graphic processor unit (GPU) and a graphic DRAM (GDRAM), requires impedance of about 60Ω. Furthermore, in the GDRAM, the input capacitance Cin is limited to 3 pF or less to insure transmission of signal wave forms at the time of high-speed operation of 700 MHz level.

Generally, a DQ pin for transmitting and receiving data is connected to complex circuit elements, such as an input buffer, an output driver, an electrostatic discharge protection circuit (herein after, referred to as "ESD"), and an ODT circuit. Thus, the input capacitance Cin including a capacitance component due to a package is easily over 3 pF. Accordingly, improvement in the field of elements or processes is required.

Furthermore, increase in the capacitance due to an ODT switch transistor necessary for the ODT circuit makes it very difficult to satisfy requirements for the input capacitance Cin. An increase in the memory operation frequency requires a decrease in the maximum allowable value of the input capacitance. Therefore, in order to reduce the input capacitance Cin, synthetic improvements, such as improvements in design approach and decreases in relevant processes and design rules, are required.

SUMMARY OF THE DISCLOSURE

Therefore, to solve the aforementioned problems in the art, an input and output driver is disclosed that is capable of effectively reducing an input capacitance Cin of a DDR-III product.

According to a preferred embodiments, an input and output driver is disclosed that is capable of effectively reducing an input capacitance Cin of a DDR-III product as well as satisfying ODT operation conditions requirements specified in a DDR-III product standard.

One disclosed input and output driver comprises: an input buffer for supplying an input data from a DQ pad to a memory cell array in a writing mode; an output driver for supplying an output data from the memory cell array to the DQ pad in a reading mode; and a DQ switch for electrically isolating the output driver from the DQ pad in the writing mode.

BRIEF DESCRIPTION OF THE DRAWINGS

The above and other advantages and features of the disclosed drives will become apparent from the following description of preferred embodiments given in conjunction with accompanying drawings, where:

FIG. 6 is a circuit diagram of the input and output driver including an ODT circuit which the DQ switch shown in FIG. 1 is applied to.

FIG. 8 is a circuit diagram of the input and output driver including an ODT circuit, an ESD circuit, and a CDM circuit, which the DQ switch shown in FIG. 1 is applied to.

DETAILED DESCRIPTION OF PREFERRED EMBODIMENTS

A disclosed input and output driver comprises: an input buffer for supplying input data from a DQ pad to a memory cell array in a writing mode; an output driver for supplying output data from the memory cell array to the DQ pad in a reading mode; and a DQ switch for electrically isolating the output driver from the DQ pad in the writing mode.

Figure 1:
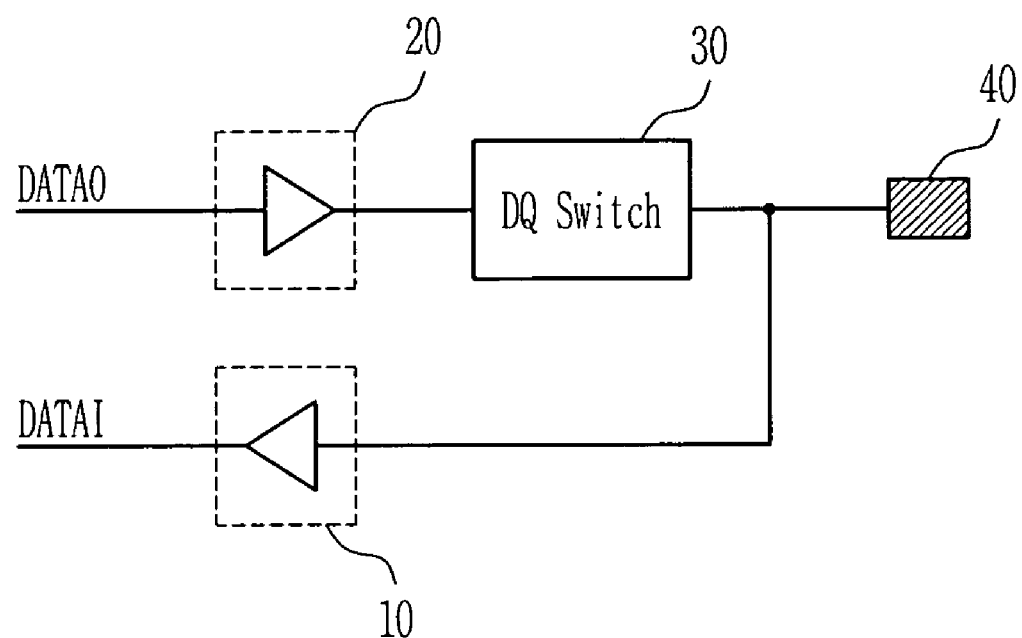
FIG. 1 is a block diagram of an input and output driver according to a preferred.

FIG. 1 is a block diagram of an input and output driver according to a preferred embodiment.

Referring to FIG. 1, an input and output driver according to a preferred embodiment comprises an input buffer 10, an output driver 20, and a DQ switch 30, and is connected to a DQ pad 40.

In a writing mode, the DQ switch 30 is turned-off to electrically isolate the output driver 20 from the DQ pad 40. On the other hand, in a reading mode, the DQ switch 30 is turned-on to electrically connect the output driver 20 to the DQ pad 40.

In the writing mode, the DQ switch 30 is tuned-off to electrically isolate the output driver 20 from the DQ pad 40, whereby it is possible to reduce increment in a capacitance due to the output driver 20. In the reading mode, the DQ switch 30 is turned-on to electrically connect the output driver 20 to the DQ pad 40, whereby the output driver 20 normally outputs data.

As shown in FIG. 1, in the writing mode, data from the DQ pad 40 is transmitted to a memory cell array (not shown) through the input buffer 10. As a result, in the writing mode, writing operation is performed through the input buffer 10 regardless of operation of the output driver 20. Therefore, in the writing mode, the input and output driver according to a preferred embodiment electrically isolates the output driver 20 from the DQ pad 40 using the DQ switch 30. As a result, it is possible to reduce increment in capacitance due to the output driver 20. On the other hand, in the reading mode, data DATAO sensed from the memory cell array is output to the DQ pad 40 through the output driver 20. Therefore, in the reading mode, the DQ switch 30 is turned-on to electrically connect the output driver 20 to the DQ pad 40.

Figure 2A:
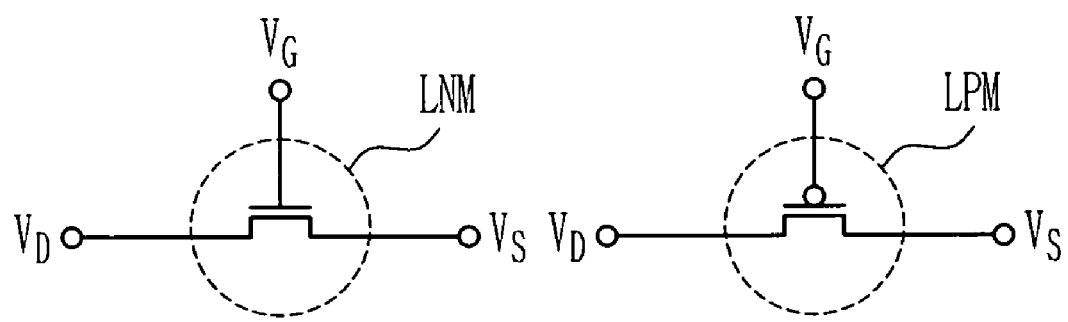
FIGS. 2A to 2C are detailed circuit diagrams of a DQ switch shown in FIG. 1.

The DQ switch 30 comprises a low voltage threshold LVT (LOW VT) NMOS transistor LNM or an LVT PMOS transistor LPM, as shown in FIG. 2A. For example, a threshold voltage VT of the LVT NMOS transistor LNM or the LVT PMOS transistor LPM is preferably 0.15V or less. In addition, a gate voltage VG of the LVT NMOS transistor LNM is preferably a pumping voltage VPP (3.5V or more) instead of a power source voltage VDD (1.8V). The pumping voltage VPP is generally twice the power source voltage.

On the other hand, a gate voltage of the LVT PMOS transistor LPM is preferably a negative pumping voltage '−VPP' or a ground voltage VSS.

Figure 3:
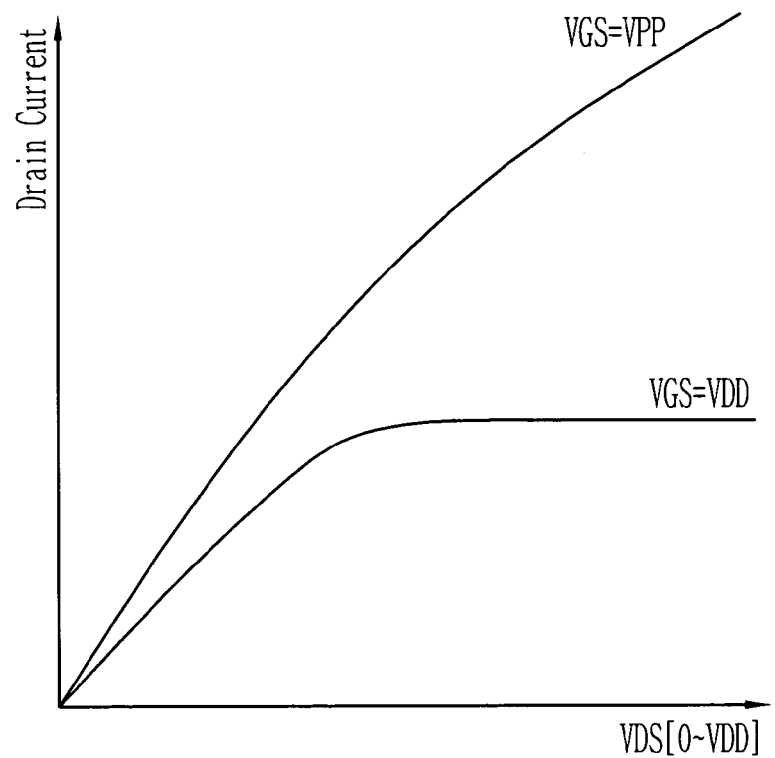
FIG. 3 is a view illustrating variation in linearity of a resistance depending on a voltage supplied to a DQ switch shown in FIG. 1.

As described above, a reason for considering the threshold voltage VT and gate voltage VG of the transistor used as the DQ switch 30 (herein after, referred to as "DQ transistor") are as follows. First, if a channel resistance loaded to the DQ transistor becomes extremely large, it is difficult to significantly ensure linearity of the total channel resistance including the channel resistance of the transistor and serial resistances, which constitute the output driver 20. Therefore, it is necessary that a gate width of the DQ transistor is maximized and the threshold voltage of the DQ transistor is minimized to minimize an on-resistance of the DQ transistor. However, since a junction capacitance due to a drain and source junction layer and a gate overlap capacitance generated at an overlapped portion between the gate electrode and the drain and source junction layer may be magnified, it is needed to adjust the gate width of the DQ transistor. Second, linearity of the channel resistance is largely changed depending on the gate voltage VG of the DQ transistor. As shown in FIG. 3, linearity of the channel resistance in the case that the gate voltage VG of the DQ transistor is 0V to the pumping voltage VPP is more excellent than that in the case that the gate voltage VG of the DQ transistor is 0V to the power source voltage VDD. Furthermore, since the threshold voltage causes voltage loss at the time of transferring HIGH signals when the gate voltage VG is the power source voltage VDD, it is preferable that the gate voltage VG is the pumping voltage VPP.

Figure 2B:
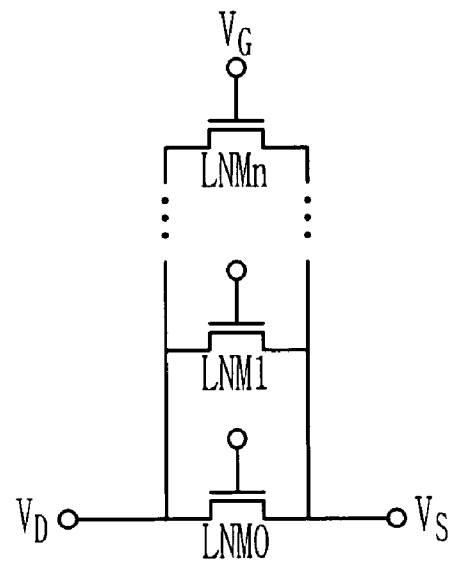
Figure 2C:
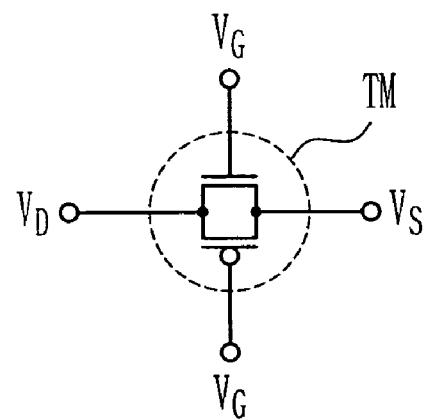

In addition, the DQ switch 30 may be comprised of a plurality of LVT NMOS transistors (LNM0 to LNMn) connected in parallel to minimize the channel resistance loaded to the DQ transistor, as shown in FIG. 2B. Similarly, the DQ switch 30 may be comprised of a plurality of LVT PMOS transistors (not shown) connected in parallel. At that time, since the total capacitance may be extremely magnified when the DQ switch 30 is comprised of a plurality of LVT NMOS or PMOS transistors connected in parallel, it is preferable to adjust the number of the LVT NMOS or PMOS transistors. On the other hand, as shown in FIG. 2A, considering linearity of the channel resistance when the DQ switch 30 is comprised of the LVT NMOS transistors LNM or LVT PMOS transistors LPM, it is preferable that the gate voltage VG is the pumping voltage VPP. However, since the used pumping voltage VPP is relatively high, it can make it difficult to design that. Therefore, as shown in FIG. 2C, the DQ switch 30 may be comprised of a transfer gate TM comprising the LVT NMOS transistor and the LVT PMOS transistor connected in parallel. In this case, each gate voltage VG may be the power source voltage VDD. The DQ switch 30 is comprised of the transfer gate TM, whereby it is possible to prevent from a voltage loss in transferring HIGH or LOW signals.

As described above, it is necessary that the DQ switch 30 is operated to be turned-off in the reading mode and turned-on in the writing mode. The operation of the DQ switch 30 will be described through circuit diagrams shown in FIGS. 4 and 5.

Figure 4:
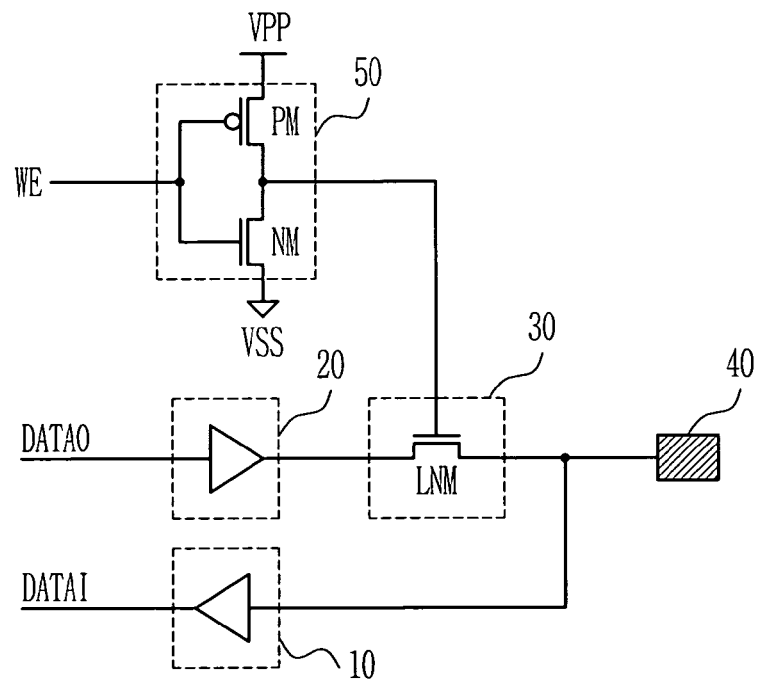
FIG. 4 is a circuit diagram illustrating an operation characteristic of an LVT NMOS transistor shown in FIG. 2A.

As shown in FIG. 4, when the DQ switch 30 is comprised of an LVT NMOS transistor LNM, a control unit 50 is constructed to operate depending on a writing enabling signal WE. The control unit 50 is comprised of a PMOS transistor PM and an NMOS transistor NM connected in serial. Inspecting the operation characteristic of the control unit, the NMOS transistor NM is turned-on and the PMOS transistor PM is turned-off depending on a writing enabling signal WE, which is enabled (HIGH level) in the writing mode. Accordingly, LVT NMOS transistor LNM is turned-off, whereby the output driver 20 is electrically isolated from the DQ pad 40. On the other hand, the NMOS transistor NM is turned-off and the PMOS transistor PM is turned-on depending on a writing enabling signal WE which is disenabled (LOW level) in the reading mode. Accordingly, LVT NMOS transistor LNM is turned-on, whereby the output driver 20 is electrically connected to the DQ pad 40.

Figure 5:
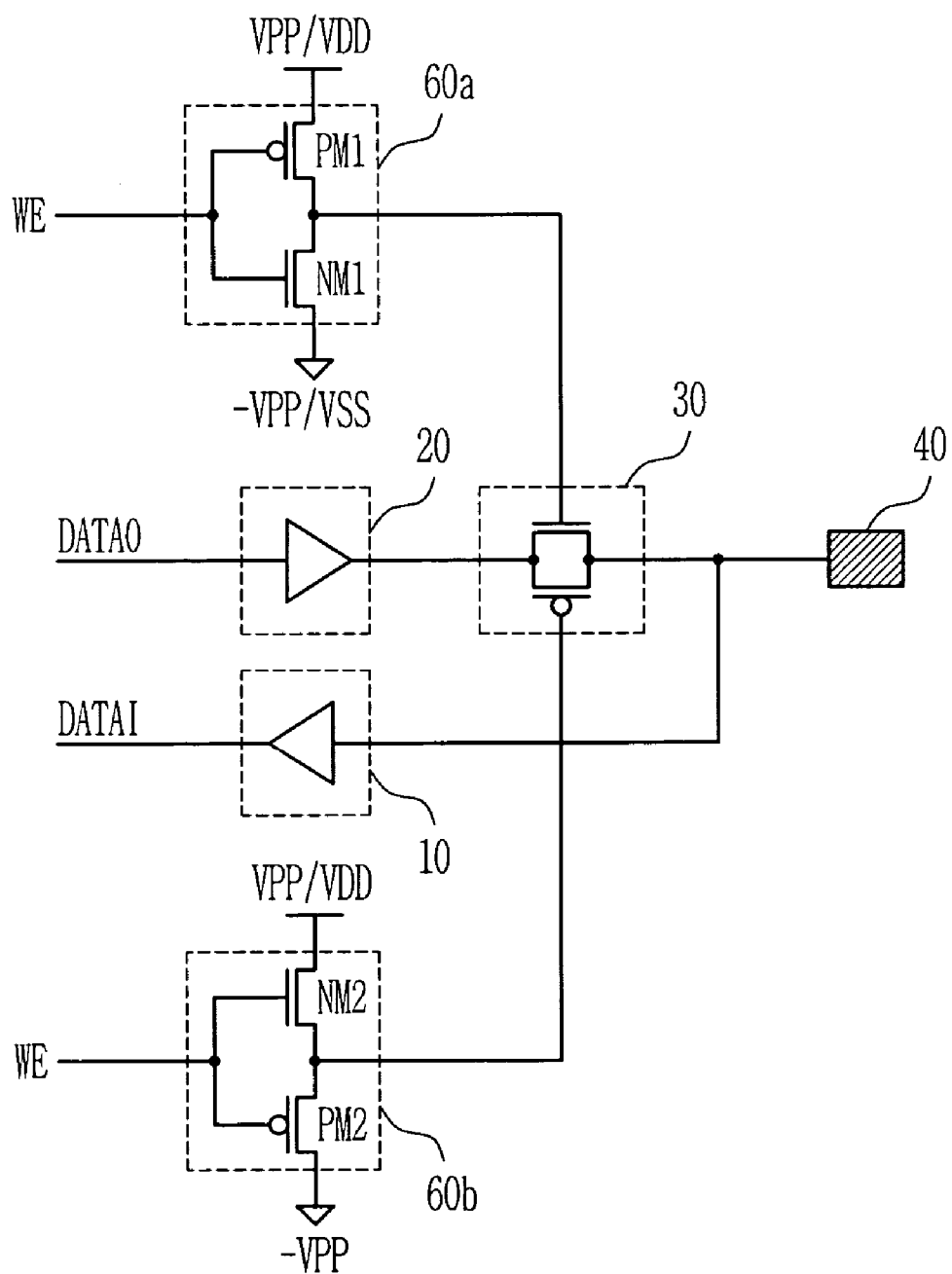
FIG. 5 is a circuit diagram illustrating an operation characteristic of a transfer gate shown in FIG. 2C.

Furthermore, as shown in FIG. 5, when the DQ switch 30 is comprised of the transfer gate TM, first and second control units 60a and 60b are constructed to operate depending on the writing enabling signal WE. The first control unit 60a is comprised of a PMOS transistor PM1 and an NMOS transistor NM1 connected in serial. The second control unit 60b is comprised of a PMOS transistor PM2 and an NMOS transistor NM2 connected in serial. Inspecting the operation characteristics of the control units 60a and 60b, the NMOS transistor NM1 is turned-on and the PMOS transistor PM1 is turned-off, and simultaneously the NMOS transistor NM2 is turned-on and the PMOS transistor PM2 is turned-off, depending on the writing enabling signal WE which is enabled in the writing mode. Accordingly, both of the NMOS transistor and the PMOS transistor in the transfer gate TM are turned-off, whereby the output driver 20 is electrically isolated from the DQ pad 40. On the other hand, the NMOS transistor NM1 is turned-off and the PMOS transistor PM1 is turned-on, and simultaneously the NMOS transistor NM2 is turned-off and the PMOS transistor PM2 is turned-on, depending on the writing enabling signal WE which is disenabled in the reading mode. Accordingly, both NMOS transistor and PMOS transistor of the transfer gate TM are turned-on, whereby the output driver 20 is electrically connected to the DQ pad 40.

Figure 6:
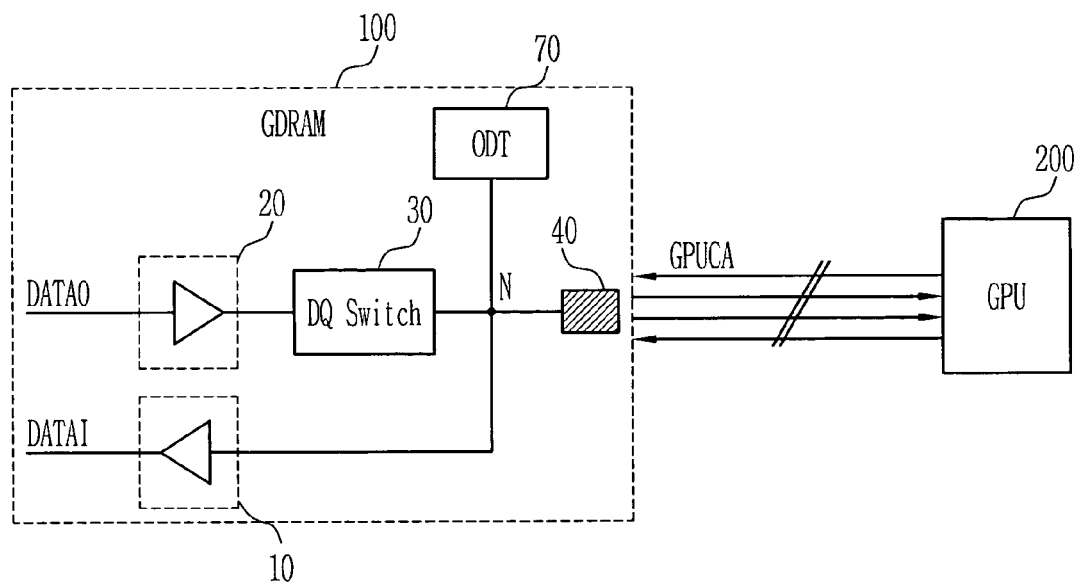
Figure 7:
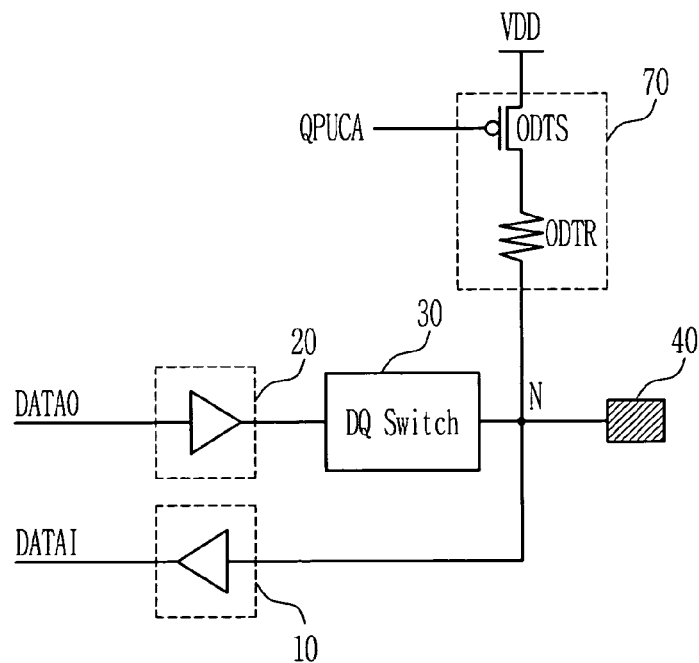
FIG. 7 is a detailed circuit diagram of the ODT circuit shown in FIG. 6.
Figure 8:
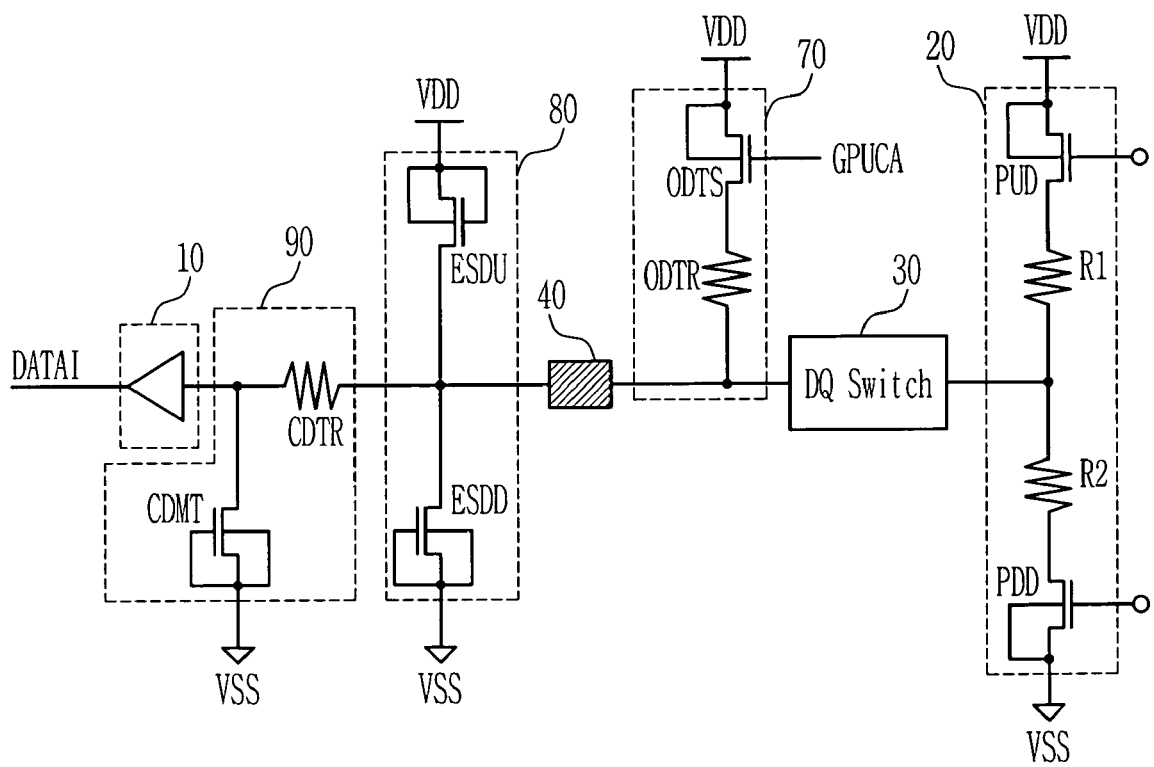

Generally, as shown in FIG. 6, in order to match impedance between a GPU 200 and a GDRAM 100, an ODT circuit 70 is provided in a GDRAM 100. The ODT circuit 70 requires an impedance of 60Ω. In the input and output driver according to the preferable embodiment of the present invention, the ODT circuit 70 is provided between a voltage source and a node N which is connected to the DQ switch 30 and the DQ pad 40. Specifically, as shown in FIG. 7, the ODT circuit 70 is connected between the node N and the voltage source for supplying the power source voltage VDD. The ODT circuit 70 is comprised of an ODT switch ODTS and an ODT resistor ODTR. The ODT switch ODTS is controlled by control signals GPUCA of the GPU 200. Furthermore, as shown in FIG. 8, the input and output driver further comprises electrostatic discharge protection ESD circuit 80 and a charged device model CDM 90 in addition to the ODT circuit 70. The ESD circuit 80 comprised of ESD transistors ESDU and ESDD connected in serial is provided between the DQ pad 40 and the CDM circuit 90. The CDM circuit 90 comprised of a CDM transistor CDMT and a CDM resistor CDMR is provided between the input buffer 10 and the ESD circuit 80.

As shown in FIG. 8, in the writing mode, the total input capacitance Cin of the input and output driver according to the preferable embodiment of the present invention is sum of junction layer capacitances and gate overlapped capacitances of the ODT switches ODTS of the input buffer 10, the CDM circuit 90, the ESD circuit 80, and the ODT circuit 70 and the DQ switch 30. In addition to the aforementioned capacitances, the total input capacitance further includes a capacitance due to a package and interconnection capacitances of signal metal lines. Since the input and output driver according to the preferable embodiment further comprises the DQ switch 30, the junction layer capacitances and the gate overlap capacitances of the transistors constituting the DQ switch 30 are increased, in comparison with the conventional input and output driver which has no DQ switch 30. However, in the writing mode, since the output driver 20 is electrically isolated from the DQ pad 40 using the DQ switch 30, the total input capacitance Cin is decreased. The more significant reason is that the capacitance increased by the junction layer capacitances and the gate overlapped capacitances of the output driver 20 is extremely larger than that increased by the DQ switch 30. This will be described with reference to table 1 as follows.

TABLE 1

| DQ pin [pF] | ESD circuit | CDM circuit | Output driver | ODT circuit | DQ switch | package | Others | total |
|---|---|---|---|---|---|---|---|---|
| DQ switch not used | 0.600 | 0.050 | 0.565 | 0.305 | 0.000 | 1.070 | 0.500 | 3.090 |
| DQ switch used | 0.600 | 0.050 | 0.000 | 0.305 | 0.176 | 1.070 | 0.500 | 2.701 |

Table 1 represents values of input capacitance Cin calculated in the input and output driver circuit designed to satisfy the DDR-III standard for GDRAM. As shown in table 1, by using the DQ switch, the input capacitance Cin of 0.39 pF (12.6%) is reduced. As a result, the input and output driver circuit satisfies a condition of the input capacitance Cin of the DDR-III standard for GDRAM.

This disclosure is not limited to the embodiments disclosed above and in the drawings. Further, it will be understood that various changes and modifications may be made to the embodiments by those who skilled in the art without departing from the spirit of this disclosure or the appended claims.

As described above, it is possible to reduce the total input capacitance Cin by electrically isolate the output driver from the DQ pad using the DQ switch in the writing mode to reduce the capacitance due to the output driver.

Furthermore, it is possible to effectively reduce the input capacitance Cin as well as to satisfy an ODT operation condition of the DDR-III standard by providing the ODT circuit and the DQ switch to the input and output driver.

What is claimed is:

1. An input and output driver comprising:
    an input buffer for supplying an input data from a DQ pad to a memory cell array in a writing mode;
    an output driver for supplying an output data from the memory cell array to the DQ pad in a reading mode; and
    a DQ switch electrically connected between the output driver and the DQ pad, the DQ switch electrically isolating the output driver from the DQ pad in the writing mode and electrically connecting the output driver to the DP pad in the reading mode.

2. An input and output driver according to claim 1, wherein the DQ switch comprises an NMOS transistor or a PMOS transistor.

3. An input and output driver according to claim 1, wherein the DQ switch comprises a low threshold voltage NMOS transistor or a low threshold voltage PMOS transistor.

4. An input and output driver according to claim 1, wherein the DQ switch comprises at least two low threshold voltage NMOS transistors or at least two low threshold voltage PMOS transistors connected in parallel.

5. An input and output driver according to claim 1, wherein the DQ switch is a transfer gate.

6. An input and output driver according to claim 5, wherein the transfer gate comprises a low threshold voltage NMOS transistor and a low threshold voltage PMOS transistor connected in parallel.

7. An input and output driver according to claim 6, wherein the low threshold voltage NMOS transistor is operated by a pumping voltage or a power source voltage.

8. An input and output driver according to claim 6, wherein the low threshold voltage PMOS transistor is operated by a negative pumping voltage or a ground voltage.

9. An input and output driver according to claim 1, wherein the DQ switch is operated by a pumping voltage higher than a power source voltage.

10. An input and output driver according to claim 1, wherein a total capacitance of the DQ switch is smaller than that of the output driver.

11. An input and output driver according to claim 1, further comprising an on-die termination circuit connected between a power source voltage and a node to which the DQ switch and the DQ pad are connected.

12. An input and output driver according to claim 1, further comprising an electrostatic discharge protection circuit and a charged device mode circuit connected between the input buffer and the DQ pad.

13. An input and output driver comprising:
    an input buffer for supplying an input data from a DQ pad to a memory cell array in a writing mode;
    an output driver for supplying an output data from the memory cell array to the DQ pad in a reading mode;
    a DQ switch connected between the output driver and the DQ pad, the DQ switch electrically isolating the output driver from the DQ pad in the writing mode and electrically connecting the output driver to the DQ pad in the reading mode;
    an on-die termination circuit connected between a power source voltage and a node to which the DQ switch and the DQ pad are connected; and
    an electrostatic discharge protection circuit connected between the input buffer and the DQ pad.

14. The input and output driver according to claim 13, wherein the DQ switch comprises a low threshold voltage NMOS transistor or a low threshold voltage PMOS transistor.

15. The input and output driver according to claim 13, wherein the DQ switch comprises at least two low threshold voltage NMOS transistors or at least two low threshold voltage PMOS transistors connected in parallel.

16. The input and output driver according to claim 13, wherein the DQ switch is a transfer gate.

17. The input and output driver according to claim 13, wherein the DQ switch is operated by a pumping voltage higher than a power source voltage.

18. The input and output driver according to claim 13, wherein a total capacitance of the DQ switch is smaller than that of the output driver.

19. The input and output driver according to claim 13, further comprising a charged device model circuit connected between the electrostatic discharge protection circuit and the input buffer.

* * * * *